United States Patent [19]

Powers et al.

[11] Patent Number: 4,529,836
[45] Date of Patent: Jul. 16, 1985

[54] STRESS ABSORPTION MATRIX

[75] Inventors: V. B. Powers, St. Petersburg; J. W. Roberts, Clearwater; J. S. Dhaliwall, Seminole, all of Fla.

[73] Assignee: Sperry Corporation, New York, N.Y.

[21] Appl. No.: 514,069

[22] Filed: Jul. 15, 1983

[51] Int. Cl.³ ............................................. H01R 4/02
[52] U.S. Cl. .................................. 174/94 R; 361/400; 228/122; 228/123
[58] Field of Search ............. 228/121, 122, 123, 56 R; 428/608; 174/94 R; 361/400

[56] References Cited

U.S. PATENT DOCUMENTS

| | | | |
|---|---|---|---|
| 2,694,852 | 11/1954 | Rogers | 428/627 |
| 3,153,581 | 10/1964 | Hutchins | 228/122 |
| 3,254,393 | 6/1966 | Grasser | 228/122 |
| 3,733,182 | 5/1973 | Crossland | 228/122 |
| 4,257,156 | 3/1981 | Houston | 228/194 |
| 4,278,990 | 7/1981 | Fichot | 228/122 |

FOREIGN PATENT DOCUMENTS 51-2653  1/1976  Japan .................................. 228/122

Primary Examiner—Nicholas P. Godici
Assistant Examiner—Chris McKee
Attorney, Agent, or Firm—Howard P. Terry

[57] ABSTRACT

An apparatus for interfacing materials and absorbing disparate thermal expansions thereof utilizes a woven wire mesh to support a predetermined thickness of a first soft solder which absorbs expansions, and utilizes a second soft solder having a lower melting point than the first to coat the surfaces of the wire mesh/first soft solder combination so that the materials can be bonded thereto.

1 Claim, 3 Drawing Figures

STRESS ABSORPTION MATRIX

BACKGROUND OF THE INVENTION

1. Field of the Invention

The present invention relates generally to interfaces between dissimilar materials, and more particularly to interfaces in microelectronic circuits between substrates and metal surfaces possessing disparate temperature coefficients of expansion.

2. Description of the Prior Art

Large substrates comprising more than one square inch of surface area have conventionally, as in the microelectronics domain, been affixed to metal surfaces via epoxies, solders, or alloys. A substrate, such as alumina or beryllia, may possess a different temperature coefficient of expansion than the metal to which it is bonded. Accordingly, when the combination is subjected to thermal variations, the materials expand at disparate rates, often precipitating shearing of the bonding material or fracturing of the substrate. To ameliorate this result, industrial practice normally entails partitioning of large substrates into smaller substrates having surface areas less than one square inch.

Thus, there is a need for an apparatus that allows larges substrates to be mounted on metal surfaces without shearing of the interfaces and jeopardizing of the substrates, upon exposure to varying temperatures.

SUMMARY OF THE INVENTION

The present invention provides an apparatus for interfacing materials and absorbing disparate thermal expansions of the materials. The invention comprises means for absorbing disparate thermal expansions of the materials, and means for supporting a predetermined thickness of the absorbing means. Means for bonding the combination of supporting and absorbing means to the materials is affixed to surface areas of the combination.

In a preferred embodiment of the invention, the supporting means comprises a woven copper wire mesh having uniform spacing, having a wire diameter not less than 0.005 inches, and having between 25 and 75 wires per linear inch. The absorbing means comprises a first soft solder, preferably an indium-lead solder having a melting point not less than 220° C. The bonding means comprises a second soft solder, preferably tin-lead or tin-lead-silver eutectic solder, having a lower melting point than the first.

The invention can also be utilized to drain heat from the materials, particularly when the wire mesh comprises thermally conductive wire such as copper.

When one of the materials comprises a substrate having an electrically conductive surface, and another material comprises a ground plane, the invention may additionally be utilized as a ground, by wrapping edges of the wire mesh/solder combination around the substrate in electrical contact with the conductive surface. Such use of the invention eliminates the need for wraparound ground planes whose processing requires stringent controls and radius substrates in order to prevent metal discontinuities.

DESCRIPTION OF THE PREFERRED EMBODIMENTS

The invention comprises a stress absorption matrix which functions as an interface between materials possessing different temperature coefficients of expansion, such as a substrate of aluminia or beryllia and a metal plate in a microelectronic circuit. The matrix bonds the one material to the other, while precluding damage that might otherwise result from disparate expansions of the materials due to temperature variations.

Figure 1:
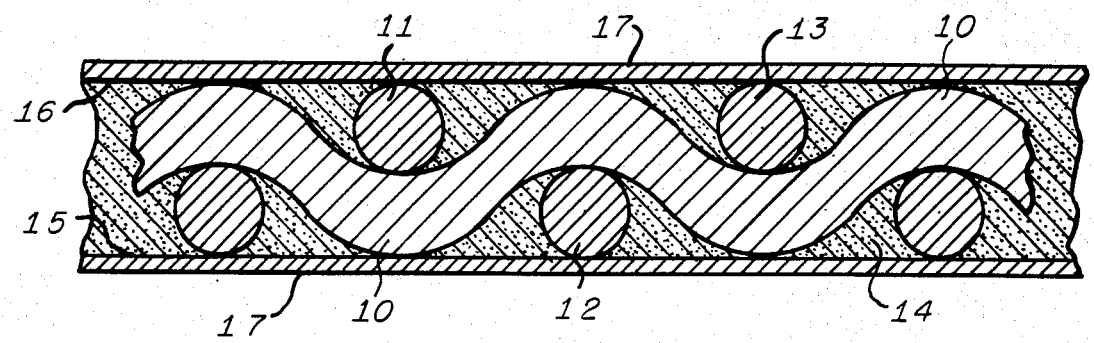
FIG. 1 is a cross sectional view of a preferred embodiment of the invention.

Referring to FIG. 1, a preferred embodiment of the invention comprises a woven mesh of wires. The wires are woven with longitudinal wires, such as a wire 10, interlaced between lateral wires such as wires 11, 12, and 13. Preferably, the longitudinal wires are disposed substantially parallel to one another, the lateral wires are disposed substantially parallel to one another, the longitudinal wires are disposed substantially perpendicular to the lateral wires, the distances between adjacent parallel wires are substantially equal, and the diameters of the wires are substantially equal. The diameter of the wire is desirably at least 0.005 inches, with 0.008 inches being preferable, whereby the woven mesh is 0.016 inches thick. From 25 to 75 wires per linear inch is desirable, with 50 per linear inch being preferred. Fewer than 25 wires per linear inch may pose difficulties in filling the relatively large gaps between wires with solder. Preferably, the wire comprises copper. The spaces surrounding the wire mesh are filled with a soft solder 14, preferably forming two planar surfaces 15 and 16 which are tangent to the wire mesh. The soft solder 14 is disposed by plating and/or solder dipping the wire mesh. The soft filler solder 14 preferably comprises a high temperature ($\geq$220° C.) lead-indium solder. One such solder comprises 75% lead and 25% indium, is solid at 250° C., plastic between 250° C. and 264° C., and liquid at 264° C. Another such solder comprises 81% lead and 19% indium, is solid at 270° C., plastic between 270° C. and 280° C., and liquid at 280° C. The surfaces 15 and 16 of the wire mesh filled with the soft solder 14 are coated with a soft solder 17. Preferably, the soft coating solder 17 comprises a solder possessing a lower melting point than the soft filler solder 14. Standard tin-lead or tin-lead-silver eutectic solders may serve as the soft coating solder 17. The lower melting point of the soft coating solder 17 permits it to be applied to the surfaces of the wire mesh/soft filler solder14 combination without damaging the combination by melting the soft filler solder 14.

Figure 2:
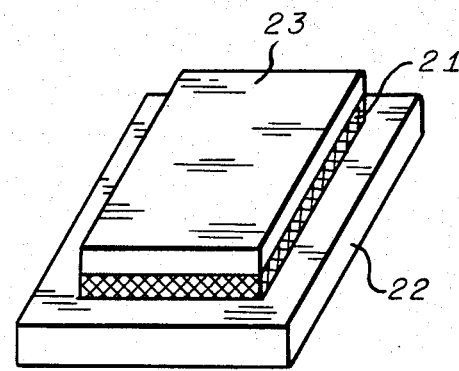
FIG. 2 is a perspective view depicting the use of a preferred embodiment of the invention with two dissimilar materials.

Referring to FIG. 2, with continuing reference to FIG. 1, a matrix 21 resulting from the combination of the wire mesh, the soft filler solder 14, and the soft coating solder 17 is bonded, via the soft coating solder 17, between two materials, 22 and 23, possessing different temperature coefficients of expansion. For example, in a microelectronic circuit, the material 22 may comprise a copper plate and the material 23 may comprise an aluminia or beryllia substrate. The melting point of the soft coating solder 17 being lower than that of the soft filler solder 14 entails additional advantages: the matrix 21 can be bonded to the materials 22 and 23 via the soft coating solder 17 without disrrupting the matrix 21 by melting the soft filler solder 14. Removal of the matrix 21 from the mateirals 22 and 23, and repair of the matrix 21 can be achieved by melting the soft coating solder 17 without affecting the soft filler solder 14. In microelectronic circuits, the matrix 21 preferably extends at least 0.010 inches beyond the perimeter of a substrate to ensure that the entire surface of the substrate is in contact with the matrix 21, and to facilitate the alignment of the substrate relative to the matrix 21. When the materials 22 and 23 expand at different rates due to temperature variations, the matrix 21 which is bonded therebetween absorbs the disparate expansions, preventing shearing of the interface and fracturing of the materials 22 and 23. In microelectronic circuits, the matrix 21 eliminates fractures of substrates which are bonded, via the matrix 21, to metal plates. Specifically, upon temperature variation, some of the resulting disparate expansion of the materials 22 and 23 is absorbed by the soft coating solder 17 which bonds the matrix 21 between the materials 22 and 23; but, the preponderance of such expansion is absorbed by the relatively thick volume of the soft filler solder 14. Accordingly, the matrix 21 allows interfacing of two or more dissimilar materials having extremely different temperature coefficients of expansion. For example, the following pairs of materials can be bonded together with the matrix 21: aluminia/copper, beryllia/copper, aluminia/aluminum, aluminia/nickel, and beryllia/nickel. Gold in the materials 22 and 23 to which the matrix 21 is bonded, such as gold in the printed circuit on a substrate, may migrate into the matrix 21, embrittling the solders 14 and 17. Accordingly, the gold content of the solder 17 and particularly the solder 14 should be kept below 2% to ensure the solders' compliancy.

If the woven mesh comprises a thermally conductive wire, such as copper, the ability of the matrix 21 to drain heat from the materials 21 and 22 is enhanced. As such, the matrix 21 comprising copper wire serves additionally as a heat sink for a substrate such as aluminia or beryllia in a microelectronic circuit. To reduce thermal resistance of the matrix 21, flaws and voids in the soft coating solder 17 and particularly in the soft filler solder 14 should be avoided.

Generally, the wire comprising the woven mesh of the matrix 21 should be solderable, in order to bond with the soft filler solder 14, and the soft coating solder 17. The wire should not oxidize, and should not harbor alkalis which may jeopardize components in a microelectronic circuit. That is, the wire should be non-corrosive. The wire should comprise no encapsulant, such as teflon or plastic coatings, which would affect the bonding of solder thereto and the transfer of heat thereby. The mesh of the wire should be uniform, to facilitate the voidless filling of the spaces between the wires with solder.

The woven wire mesh serves as a framework for supporting the soft filler solder 14 at a predetermined thickness, and as a heat sink, particularly when the mesh comprises thermally conductive wire such as copper.

The soft filler solder 14 serves as a compliant medium for absorbing disparate thermal expansions of the materials 22 and 23 between which the matrix 21 is bonded. The soft coating solder 17 serves primarly to bond the matrix 21 to the materials 22 and 23, but serves additionally to absorb some of the disparate thermal expansion of the materials 22 and 23.

The matrix 21 can be utilized as an interface between more than two dissimilar materials. For example, several materials in one plane may be bonded to several materials in another plane via the matrix, such that, more than one material in one plane is interfaced with a single material in the other plane.

Figure 3:
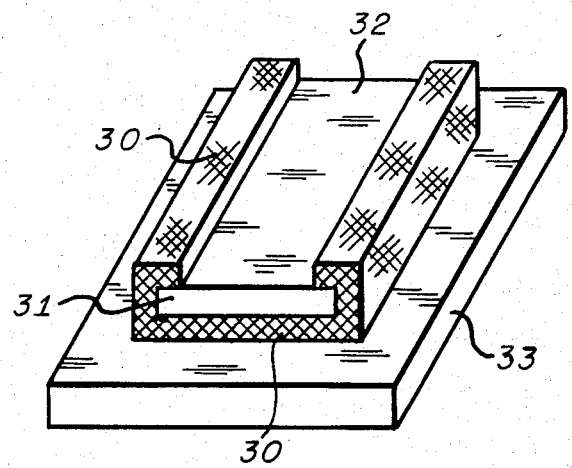
FIG. 3 is a perspective view depicting the additional use of a preferred embodiment of the invention as a ground.

A stress absorption matrix can also be utilized as a ground. For example, referring to FIG. 3, a stress absorption matrix 30 is bonded between a substrate 31, having an electrically conductive surface 32, and a ground plane 33. The edges of the matrix 30 are wrapped around the substrate 31 making electrical contact with the electrically conductive surface 32 of the substrate 31. In this fashion, the matrix 30 serves not only to absorp disparate thermal expansions of the ground plane 33 and the substrate 31, but also to ground the substrate 31, conveying current from the conductive surface 32 of the substrate 31 to the ground plane 33.

While the invention has been described in its preferred embodiments, it is to be understood that the words which have been used are words of description rather than limitation and that changes within the purview of the appended claims may be made without departing from the true scope and spirit of the invention in its broader aspects.

We claim:

1. An apparatus for grounding an electrically conductive material comprising:
 a first material comprising an electrically conductive ground plane,
 a second material having a top and bottom surface, said top surface being electrically conductive,
 a woven wire mesh having electrically conductive longitudinal and lateral wires,
 a first soft solder filler disposed around said longitudinal and lateral wires forming thereby substantially planar surfaces on both sides of said wire mesh, and
 a second soft solder having a lower melting point than said first solder for coating planar surfaces of said soft solder filler, wire mesh combination,
 said wire mesh filled and coated with said first and second solder being disposed between said ground plane and said bottom surface of said second material, peripheral edges of said solder filled and coated wire mesh being folded over said second material such that said electrically conductive top surface is in electrical contact with said solder filler and coated wire mesh thereby providing an electrically conductive path from said electrically conductive top surface to said ground plane.

* * * * *